(12) United States Patent
Hoegele et al.

(10) Patent No.: US 8,705,000 B2
(45) Date of Patent: Apr. 22, 2014

(54) ILLUMINATION OPTICS AND PROJECTION EXPOSURE APPARATUS

(75) Inventors: Artur Hoegele, Oberkochen (DE); Markus Deguenther, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 562 days.

(21) Appl. No.: 12/846,470

(22) Filed: Jul. 29, 2010

(65) Prior Publication Data

US 2011/0019172 A1      Jan. 27, 2011

Related U.S. Application Data

(63) Continuation of application No. PCT/EP2008/009914, filed on Nov. 22, 2008.

(60) Provisional application No. 61/025,344, filed on Feb. 1, 2008.

(30) Foreign Application Priority Data

Feb. 1, 2008    (DE) .......................... 10 2008 007 449

(51) Int. Cl.
*G03B 27/42*         (2006.01)
(52) U.S. Cl.
USPC .................................. 355/53; 355/67; 355/77
(58) Field of Classification Search
USPC ................................ 355/53, 67, 77; 359/793
See application file for complete search history.

(56) References Cited

U.S. PATENT DOCUMENTS

| 6,127,095 A | 10/2000 | Kudo |
| 6,281,967 B1 | 8/2001 | Kudo |
| 6,560,044 B2 | 5/2003 | Shinoda |
| 2002/0171944 A1* | 11/2002 | Suenaga et al. ............... 359/689 |
| 2004/0218164 A1* | 11/2004 | Kohno ............................ 355/67 |
| 2005/0190350 A1* | 9/2005 | Shinoda ......................... 355/53 |

FOREIGN PATENT DOCUMENTS

| DE | 10 2006 025 025 | 11/2007 |
| EP | 0 940 722 | 9/1999 |
| EP | 1 522 893 | 4/2005 |
| EP | 1 798 758 | 6/2007 |

OTHER PUBLICATIONS

International Search Report and a Written Opinion from the counterpart PCT Application No. PCT/EP2008/009914, dated Mar. 3, 2009.

* cited by examiner

*Primary Examiner* — Steven H Whitesell Gordon
*Assistant Examiner* — Mesfin T Asfaw
(74) *Attorney, Agent, or Firm* — Fish & Richardson P.C.

(57) ABSTRACT

An illumination optics illuminates an object field of a projection exposure apparatus for microlithography. The illumination optics include a condenser group of optical components which guide a bundle of useful light. An objective group of bundle-guiding components is arranged downstream of the condenser group. At least one component of the condenser group and at least one component of the objective group are displaceable for compensation of deviations of the object field, which is in an actual illumination state, from a desired illumination state.

28 Claims, 12 Drawing Sheets

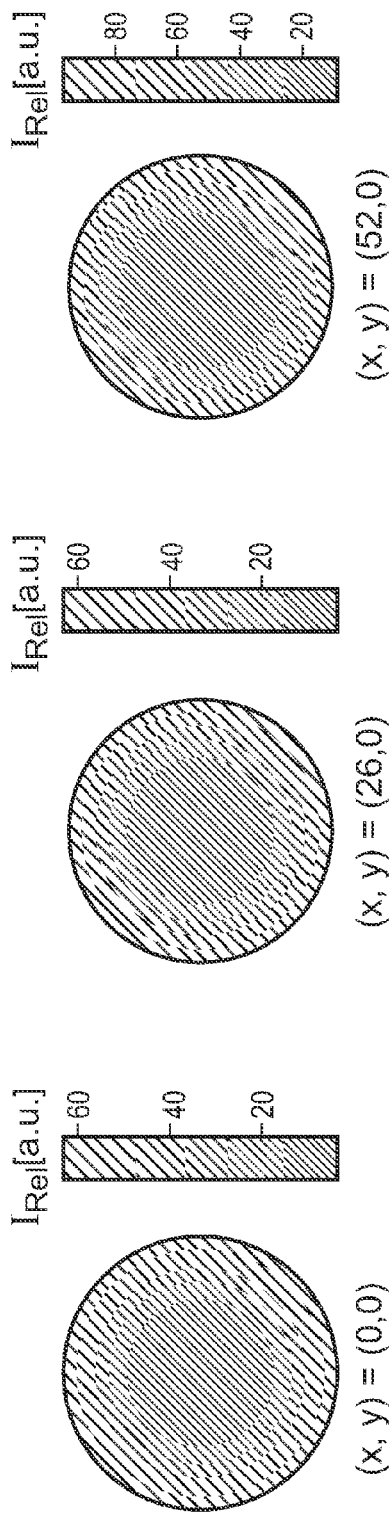
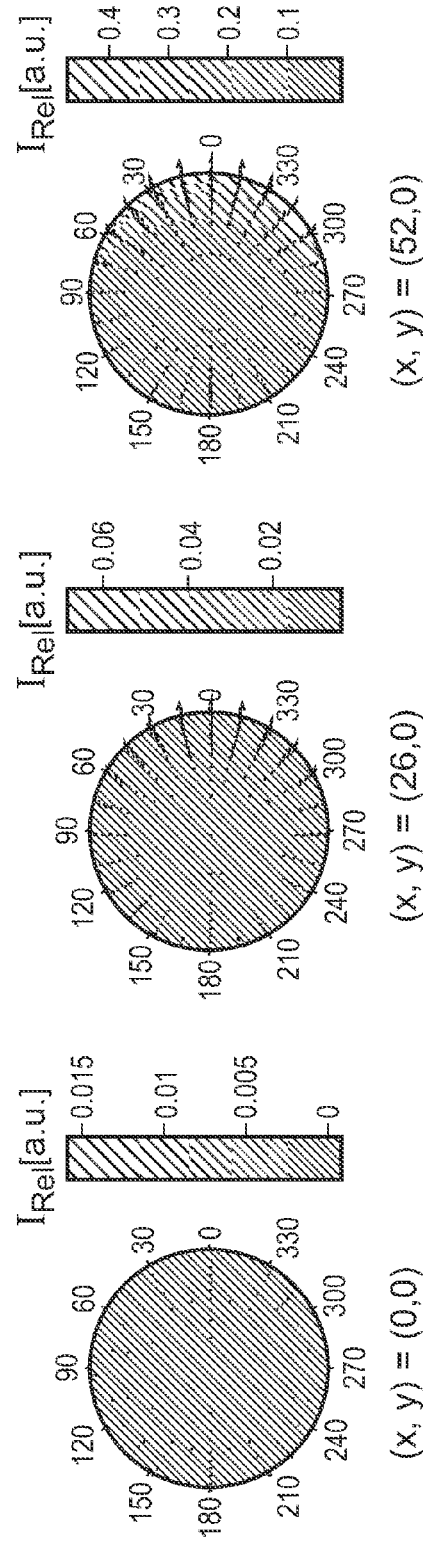
Fig. 6  (x, y) = (0,0)
Fig. 7  (x, y) = (26,0)
Fig. 8  (x, y) = (52,0)
Fig. 9  (x, y) = (0,0)
Fig. 10 (x, y) = (26,0)
Fig. 11 (x, y) = (52,0)

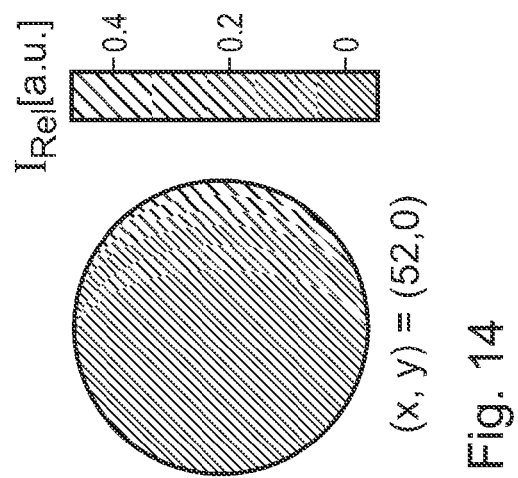
Fig. 14 (x, y) = (52,0)
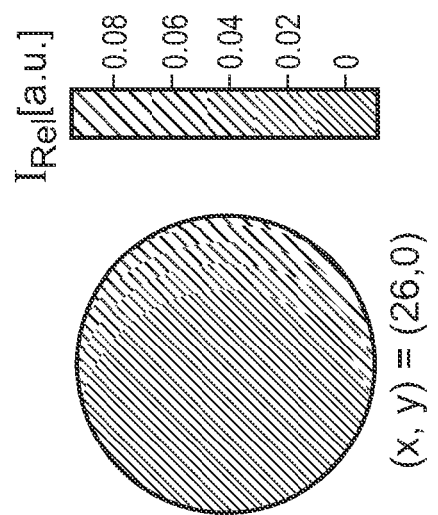
Fig. 13 (x, y) = (26,0)
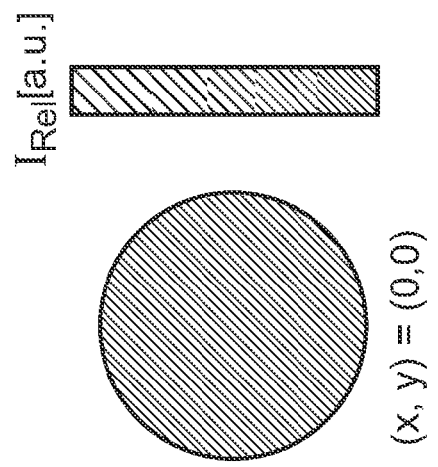
Fig. 12 (x, y) = (0,0)

ILLUMINATION OPTICS AND PROJECTION EXPOSURE APPARATUS

CROSS-REFERENCE TO RELATED APPLICATIONS

This application is a continuation of, and claims benefit under 35 USC 120 to, international application PCT/EP2008/009914, filed Nov. 22, 2008, which claims benefit of German Application No. 10 2008 007 449.7, filed Feb. 1, 2008 and U.S. Ser. No. 61/025,344, filed Feb. 1, 2008. International application PCT/EP2008/009914 is hereby incorporated by reference in its entirety.

FIELD

The disclosure relates to an illumination optics, an illumination system including such an illumination optics, a projection exposure apparatus including such an illumination system, a method of producing structured components using such a projection exposure apparatus of this type, and a component produced by such a method.

BACKGROUND

An illumination optics is known from EP 0 940 722 A2 and the documents cited therein. A displaceable lens group is provided in the objective group for influencing the optical aberration of the objective group and for influencing an intensity distribution of the useful light in the object field.

DE 10 2006 025 025 A1 discloses an illumination optics including a condenser group and an objective group. The objective group includes displaceable optical elements.

U.S. Pat. No. 6,560,044 B2 discloses an illumination optics including a condenser group and an objective group, wherein the condenser group includes displaceable optical elements.

U.S. Pat. No. 6,127,095 A describes an illumination optics including a condenser group which includes optical elements that are displaceable along an optical axis and tiltable relative to the optical axis.

SUMMARY

The disclosure provides an illumination optics configured so that a compensating effect may be exerted on illumination parameters of the object field illumination. The illumination parameters are in particular dependent on an illumination setting, in other words an illumination angle distribution.

A pair of optical components, which is displaceable for compensation and wherein one component belongs to the condenser group and one component belongs to the objective group, allows particular illumination parameters to be optimized, wherein other illumination parameters may be limited to predefined ranges. This permits compensation of illumination parameter changes which are due to variations during the production of the components of the illumination optics or by lifetime or drift effects. Changing the illumination parameters by way of a compensating displacement of the pair of components may also be useful to compensate for parameter changes which are due to a change in the illumination angle distribution, in other words an illumination setting change. Likewise, this also allows compensation of illumination parameter changes which are due to a polarization change of the illumination light or a change in size of the object field to be exposed. Moreover, it is conceivable as well to use the compensating pair of components as a way to design so as to ensure that demanding tolerance limits of particular illumination parameters are not exceeded. The compensating displacement of the pair of components may in particular have an impact on telecentricity values and on the balance between illumination light portions from various illumination directions.

In some embodiments, a displacement drive ensures an automated compensating displacement.

In some embodiments, a displaceability in particular allows compensation of a telecentricity. This may affect both an energetic telecentricity, in other words the intensity relationship between edge rays which are opposite to each other relative to a meridional section and illuminate a field point, as well as a geometric telecentricity, in other words an inclination of an entire radiation sub-bundle which illuminates a field point.

In some embodiments, a displacement path simplifies the construction of the displacement drive and has surprisingly turned out to be sufficient for a compensating displacement in many practical applications. Likewise, a displacement path in the range of 500 μm has turned out to be particularly advantageous for particular arrangements. The displacement path may be in the range of 300 μm.

In some embodiments, a positioning accuracy is particularly well adapted with respect to a compensating displacement of the components. A positioning accuracy of better than 15 μm can be preferred.

In some embodiments, a decentering displacement in particular allows illumination angle parameters to be adapted to a size or a position of the object field to be illuminated.

In some embodiments, for particular arrangements, a decentering displacement path in the range of 100 μm has turned out to be sufficient. The decentering displacement path may be in the range of 200 μm. For particular applications, positioning accuracies for the decentering displacement path of for example up to at least 5 μm can be preferred.

In some embodiments, a tilting displacement may in many cases serve as an alternative to a decentering displacement.

In some embodiments, the tilting displacement drive may have a tilting displacement path in the range of 5 angular minutes. The tilting displacement drive may have a positioning accuracy of better than 0.25 angular minutes.

In some embodiments, a component selection for the displaceable components results in components which are particularly sensitive to a compensation of selected illumination parameters.

In some embodiments, the same applies to a focal length/optical power selection for the displaceable components. The displaceable component of the condenser group may have an absolute value of its focal length which is smaller than 400 mm. The displaceable component of the objective assembly may have an absolute value of its focal length which is smaller than 400 mm.

In some embodiments, numbers of displaceable components of the condenser group or numbers of displaceable components of the objective group have turned out to be sufficient for most optimization features. As a general rule, at least one sixth of the components but no more than two sixths of the number of these components may be displaceable at a given number of bundle-guiding components of the condenser group. At a given number of components of the objective group, at least one ninth of the components but generally no more than two ninths of the number of these components may be displaceable.

In some embodiments, the advantages of an illumination system correspond to those describe above with reference to the illumination optics.

In some embodiments, an adjustment device in particular provides for an automated adjustment of an illumination setting. The adjustment device can be connected to the control device of the compensation displacement drive via a signal so as to ensure that a compensating displacement of the displaceable components of the illumination optics is actuable automatically after changing the illumination setting.

In some embodiments, the advantages of a projection exposure apparatus correspond to those described above with reference to the illumination system. The same applies to some embodiments of a production method and to some embodiments of a structured component.

BRIEF DESCRIPTION OF THE DRAWINGS

Embodiments of the disclosure will hereinafter be explained in more detail with reference to the drawings, in which:

FIGS. 6 to 8 show wavefront changes, caused by the compensating displacement, at various field points;

FIGS. 9 to 11 show pupil aberrations, caused by the compensating displacement, at the field points of FIGS. 6 to 8;

FIGS. 12 to 14 show pupil intensity changes, caused by the compensating displacement, at the field points of FIGS. 6 to 8;

DETAILED DESCRIPTION

Figure 1:
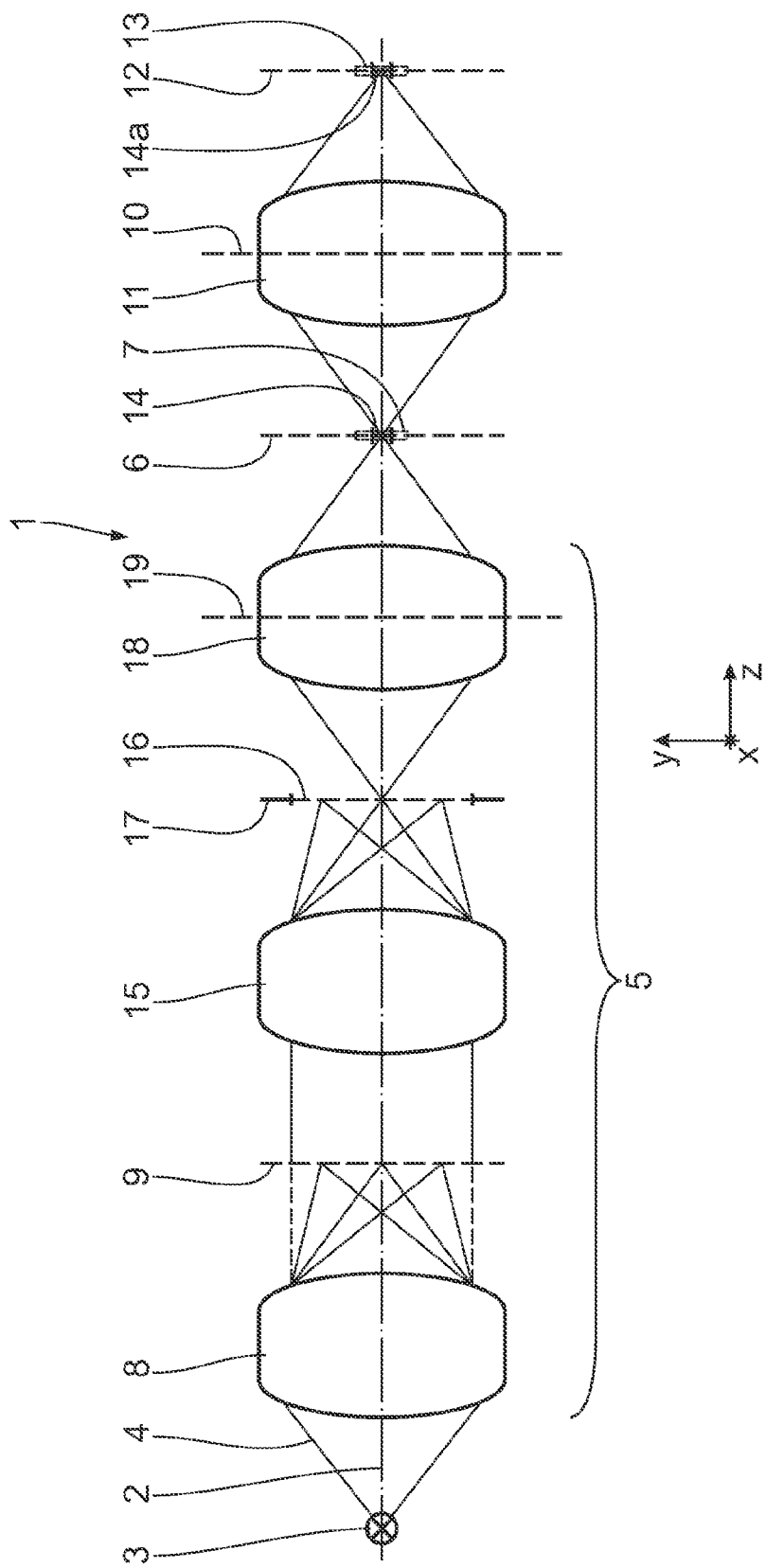
FIG. 1 shows a schematic meridional section through optical main groups of a projection exposure apparatus for microlithography.

FIG. 1 shows a schematic meridional section through the optical main groups of a projection exposure apparatus 1. In this schematic illustration, the optical main groups are refractive optical elements. The optical main groups may however also be diffractive or reflective components or combinations or subcombinations of refractive/diffractive/reflective assemblies of optical elements.

An xyz coordinate system will hereinafter be used to facilitate the description of positional relationships. In FIG. 1, the x-axis extends into the drawing plane in a direction perpendicular to the drawing plane. The y-axis extends upwardly in FIG. 1. The z-axis extends to the right of FIG. 1 and is parallel to an optical axis 2 of the projection exposure apparatus 1. If required, the optical axis 2 may also be folded several times.

The projection exposure apparatus 1 has a radiation source 3 which generates useful light in the shape of an illumination radiation bundle or imaging radiation bundle 4, respectively. The useful light 4 has a wavelength which is in the deep ultraviolet range (DUV), for instance in the range of between 100 and 20 nm. Alternatively, the wavelength of useful light 4 may also be in the extreme ultraviolet range (EUV), in particular between 5 and 30 nm.

An illumination optics 5 of the projection exposure apparatus 1 guides the useful light 4 from the radiation source 3 to an object plane 6 of the projection exposure apparatus 1. An object in the form of a reticle 7, which is to be imaged via the projection exposure apparatus 1, is arranged in the object plane 6. The reticle 7 is shown by dashed lines in FIG. 1. The reticle 7 is supported on a holding device (not shown) which is configured for a controlled scanning displacement or a gradual displacement.

The first optical main group of the illumination optics 5 is a pupil-forming optics 8. The pupil-forming optics 8 serves to generate a defined intensity distribution of the useful light 4 in a downstream pupil plane 9. Furthermore, the pupil-forming optics 8 serves as an adjustment device for defining various illumination settings. Similar adjustment devices, which are for example equipped with displaceable optical components or interchangeable stops, are known to those skilled in the art. The pupil-forming optics 8 images the radiation source 3 into the pupil plane 9 in such a way that a plurality of secondary light sources is obtained. The pupil-forming optics may additionally have a field-forming function. The pupil-forming optics 8 may be equipped with facet elements, honeycomb elements and/or diffractive optical elements. The pupil plane 9 is optically conjugated with another pupil plane 10 of a projection objective 11 of the projection exposure apparatus 1. The projection objective 11 is arranged downstream of the illumination optics 5 between the object plane 6 and an image plane 12. Arranged in the image plane 12 is a wafer 13 which is shown by a dashed line in FIG. 1. The wafer 13 is supported on a holding device (not shown) which is configured for a controlled scanning displacement or a gradual displacement. The projection objective 11 is used to image an object field 14 in the object plane 6 into an image field 14a in the image plane 12.

Another optical main group of the illumination optics 5 is a field lens group 15 that is arranged downstream of the pupil plane 9 behind the pupil-forming optics 8. Downstream of the field lens group 15 is arranged an intermediate image plane 16 which conjugated with the object plane 6. The field lens group 15 is therefore a condenser group. A stop 17 is disposed in the intermediate field plane 16 for defining an edge boundary of the object field 14. The stop 17 is also referred to as REMA (reticle masking system for masking the reticle 7) stop.

The intermediate image plane 16 is imaged into the object plane 6 via an objective group 18 which is also referred to as REMA lens group. The objective group 18 is another optical main group of the illumination optics 5.

Figure 2:
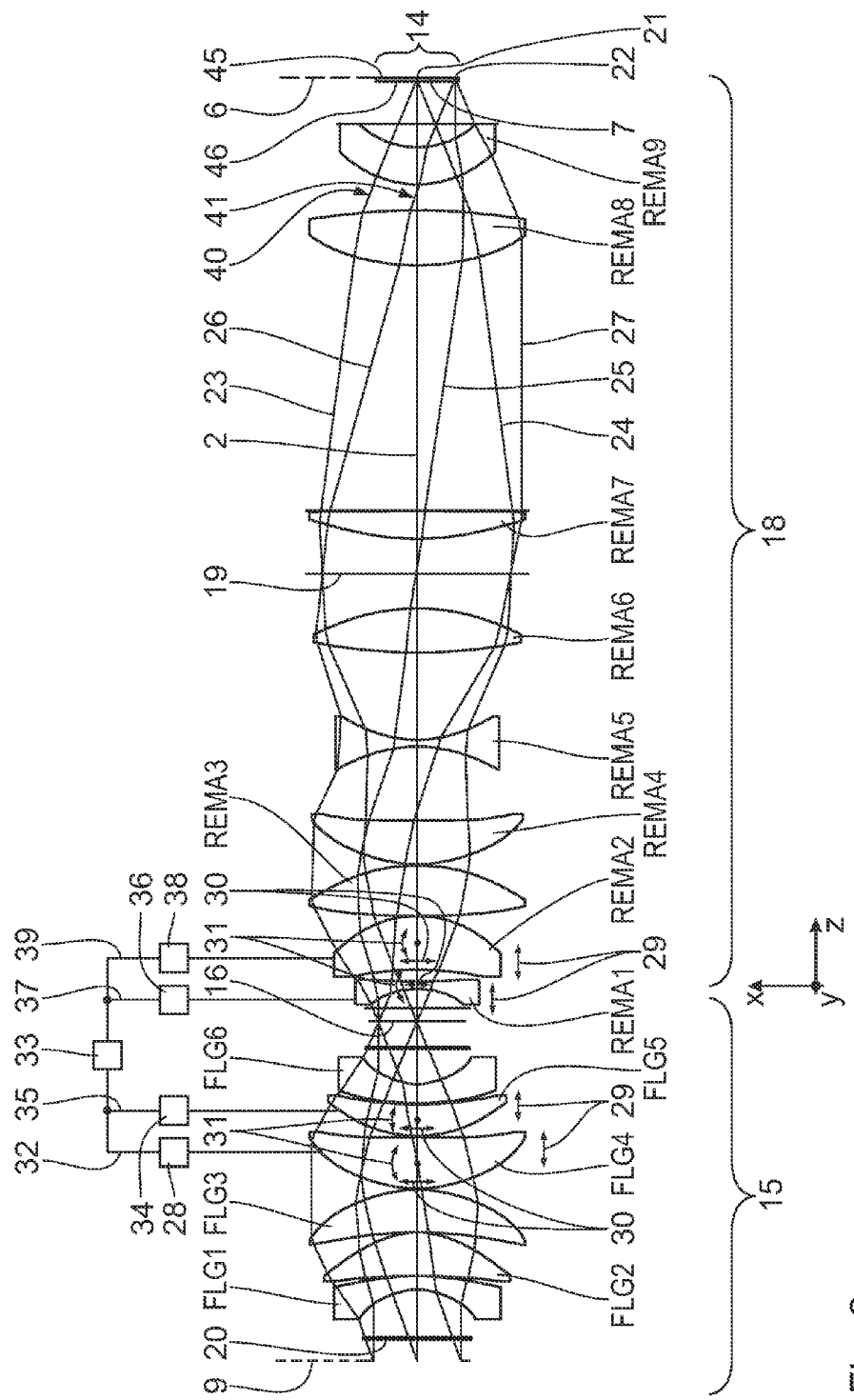
FIG. 2 shows a more detailed view of two of the optical main groups of an illumination optics of the projection exposure apparatus according to FIG. 1.

FIG. 2 shows a more detailed view of the field lens group and the REMA lens group 18. The field lens group 15 includes a total of six lenses which are arranged in succession and are referred to as FLG1, FLG2, FLG3, FLG4, FLG5 and FLG6 according to the light path direction of the useful light 4 when passing through the field lens group 15. The lenses FLG5 and FLG6 form a pair of lenses which replaces a meniscus lens.

A scattering plate 20 is arranged between the pupil plane 9 and the lens FLG1.

The REMA lens group 18 includes a total of nine lenses which are hereinafter referred to as REMA1, REMA2, REMA3, REMA4, REMA5, REMA6, REMA7, REMA8 and REMA9 according to the light path direction of the useful light 4. The lenses REMA1 and REMA2 form a pair of lenses which replaces a meniscus lens.

Another pupil plane 19 is arranged between the lenses REMA6 and REMA7. The object plane 6 with the reticle 7 is arranged downstream of the lens REMA9 of the REMA lens group 18, which is the last lens when seen in the direction of the rays.

The following tables show the design data of the optical assembly according to FIG. 2, in other words the field lens group 15 and the REMA lens group 18. The first column of the first table shows the optical surfaces of the field lens group 15 and, afterwards, those of the REMA lens group 18 which are numbered from the left to the right. This will hereinafter be explained in more detail via selected surfaces. "Surface 1" is the pupil plane 9. "Surfaces 2 and 3" are the entrance and exit surfaces of the scattering plate 20. "Surfaces 4 and 5" are the entrance and exit surfaces of the lens FLG1. "Surfaces 8 and 9" are the entrance and exit surfaces of the lens FLG 3. "Surfaces 10 and 11" are the entrance and exit surfaces of the lens FLG 4. "Surfaces 12 and 13" are the entrance and exit surfaces of the lens FLG 5. "Surfaces 16 and 17" are the entrance and exit surfaces of a gray filter upstream of the intermediate image plane 16. "Surface 18" is the intermediate image plane 16. "Surfaces 20 and 21" are the entrance and exit surfaces of the lens REMA1. "Surfaces 22 and 23" are the entrance and exit surfaces of the lens REMA2. "Surfaces 34 and 35" are the entrance and exit surfaces of the lens REMA 7.

"Surfaces 40 and 41" are the entrance and exit surfaces of the lens REMA9. "Surface 43" is an entrance surface of the reticle 7. "Surface 44" is the exit surface of the reticle 7, which coincides with the object plane 6. The column "radii" contains the curvature radii of the optical surfaces. A radius value which is followed by the abbreviation AS indicates that the associated optical surface is an aspheric surface. The column "thicknesses" contains the distances of the optical surfaces from the subsequent optical surface.

The column "glasses" provides information about the lens material that is used and about the purge gas that is contained between the optical components. The purge gas is nitrogen at atmospheric pressure.

The column "refractive index" contains the refractive indices of the lens materials and of the purge gas at a design light wavelength of 193.38 nm. The column "half diameter" contains the free half diameters of the optical components.

| SURFACE | RADII | THICKNESSES | GLASSES | REFRACTIVE INDEX 193.38 nm | HALF DIAMETER |
|---|---|---|---|---|---|
| 1 | 0.000000000 | 30.000000000 | N2VP975 | 1.00030800 | 62.540 |
| 2 | 0.000000000 | 4.000000000 | CAF2N2 | 1.50193400 | 73.459 |
| 3 | 0.000000000 | 67.575962334 | N2VP975 | 1.00030800 | 74.395 |
| 4 | −102.282365452 | 19.675654616 | SIO2VO | 1.56081000 | 83.343 |
| 5 | −440.020481282 | 0.915410017 | N2VP975 | 1.00030800 | 114.488 |
| 6 | −803.337775613 | 61.049379511 | SIO2VO | 1.56081000 | 121.175 |
| 7 | −145.821092104AS | 0.878404287 | N2VP975 | 1.00030800 | 128.245 |
| 8 | −609.645798584 | 60.891484394 | SIO2VO | 1.56081000 | 146.419 |
| 9 | −198.062490587 | 0.836776312 | N2VP975 | 1.00030800 | 150.072 |
| 10 | 196.925287819 | 74.825300909 | SIO2VO | 1.56081000 | 150.014 |
| 11 | 1645.165713144 | 0.871805701 | N2VP975 | 1.00030800 | 145.576 |
| 12 | 179.267676651AS | 45.849665228 | SIO2VO | 1.56081000 | 122.904 |
| 13 | 567.853932452 | 0.892941770 | N2VP975 | 1.00030800 | 115.532 |
| 14 | 336.510398438 | 27.208964796 | SIO2VO | 1.56081000 | 108.756 |
| 15 | 94.792662929 | 49.913447856 | N2VP975 | 1.00030800 | 76.124 |
| 16 | 0.000000000 | 3.050000000 | SIO2VO | 1.56081000 | 71.185 |
| 17 | 0.000000000 | 36.750000000 | N2VP975 | 1.00030800 | 70.394 |
| 18 | 0.000000000 | 20.000000000 | N2VP975 | 1.00030800 | 55.626 |
| 19 | 0.000000000 | 26.396909378 | N2VP975 | 1.00030800 | 63.922 |
| 20 | −106.710816985 | 11.983919597 | SIO2VO | 1.56081000 | 65.539 |
| 21 | 3649.246336349 | 14.958315137 | N2VP975 | 1.00030800 | 84.485 |
| 22 | −456.436808941 | 77.542056860 | SIO2VO | 1.56081000 | 90.171 |
| 23 | −158.779736614AS | 0.962604569 | N2VP975 | 1.00030800 | 115.236 |
| 24 | 900.932620608 | 71.966008779 | SIO2VO | 1.56081000 | 147.006 |
| 25 | −257.889732610 | 0.968884887 | N2VP975 | 1.00030800 | 149.739 |
| 26 | 208.306293491 | 62.375623603 | SIO2VO | 1.56081000 | 147.051 |

-continued

| SURFACE | RADII | THICKNESSES | GLASSES | REFRACTIVE INDEX 193.38 nm | HALF DIAMETER |
|---|---|---|---|---|---|
| 27 | 994.585222840 | 106.008325968 | N2VP975 | 1.00030800 | 143.002 |
| 28 | −186.450935841AS | 9.980539912 | SIO2VO | 1.56081000 | 113.456 |
| 29 | 197.217304481 | 124.185935998 | N2VP975 | 1.00030800 | 108.722 |
| 30 | 731.593005073 | 63.393462537 | SIO2VO | 1.56081000 | 141.736 |
| 31 | −315.217923328 | 49.969386933 | N2VP975 | 1.00030800 | 143.489 |
| 32 | 0.000000000 | 0.000000000 | N2VP975 | 1.00030800 | 134.927 |
| 33 | 0.000000000 | 49.915432143 | N2VP975 | 1.00030800 | 134.927 |
| 34 | 393.832511057AS | 40.103675322 | SIO2VO | 1.56081000 | 150.026 |
| 35 | −5462.400468456 | 0.000000000 | N2VP975 | 1.00030800 | 150.143 |
| 36 | 0.000000000 | 169.289941809 | N2VP975 | 1.00030800 | 150.142 |
| 37 | 0.000000000 | 180.997560735 | N2VP975 | 1.00030800 | 212.240 |
| 38 | 295.172936341 | 79.000000000 | SIO2VO | 1.56081000 | 150.062 |
| 39 | −653.730946963AS | 37.517313773 | N2VP975 | 1.00030800 | 144.704 |
| 40 | 152.552362015 | 52.626495352 | SIO2VO | 1.56081000 | 106.547 |
| 41 | 119.052314893 | 33.557963261 | N2VP975 | 1.00030800 | 81.906 |
| 42 | 0.000000000 | 60.000000000 | N2VP975 | 1.00030800 | 81.524 |
| 43 | 0.000000000 | 6.300000000 | SIO2VO | 1.56081000 | 56.179 |
| 44 | 0.000000000 | 0.000000000 | N2VP975 | 1.00030800 | 55.335 |
| 45 | 0.000000000 | 0.000000000 | N2VP975 | 1.00030800 | 55.335 |

The exit surface of the lens FLG 5 ("surface 7"), the entrance surface of the lens FLG 2 ("surface 12"), the exit surface of the lens REMA2 ("surface 23"), the entrance surface of the lens REMA5 ("surface 28"), the entrance surface of the lens REMA7 ("surface 34") and the exit surface of the lens REMA 8 ("surface 39") are aspheric surfaces according to the aspheric formula $$p(h) = [((1/r)h^2)/(+\mathrm{SQRT}(1-(1+K)(1/r)^2 h^2))] + C1 \cdot h^4 + C2 \cdot h^6 + \ldots$$

$1/r$ is the curvature of the surface at the apex of the asphere. h is the distance of a point on the optical surface of the asphere from the rotational symmetry axis of the optical surface, in other words the optical axis which extends in the z-direction. p(h), the sagittal height, is the z-distance between a particular point, which is at a distance of $h(h^2 = x^2 + y^2)$ from the rotational symmetry axis, relative to the apex of the optical aspheric surface, in other words the point on the optical surface where h=0. The coefficients C3 et seq. are further even exponents to h starting from $h^8$.

The following tables show the coefficients K as well as C1 to C9 which need to be substituted into the above aspheric formula in order to obtain the respective aspheric optical surface.

Aspheric Constants

| SURFACE NO. 7 | |
|---|---|
| K | −0.6575 |
| C1 | 1.04920909e−008 |
| C2 | −5.71812687e−013 |
| C3 | 1.98132786e−017 |
| C4 | 6.03985545e−022 |
| C5 | 0.00000000e+000 |
| C6 | 0.00000000e+000 |
| C7 | 0.00000000e+000 |
| C8 | 0.00000000e+000 |
| C9 | 0.00000000e+000 |

| SURFACE NO. 12 | |
|---|---|
| K | 0.1370 |
| C1 | 9.15826038e−009 |
| C2 | −1.74751893e−012 |
| C3 | 3.97290883e−017 |
| C4 | −3.14687666e−021 |
| C5 | 0.00000000e+000 |
| C6 | 0.00000000e+000 |
| C7 | 0.00000000e+000 |
| C8 | 0.00000000e+000 |
| C9 | 0.00000000e+000 |

| SURFACE NO. 23 | |
|---|---|
| K | −0.2784 |
| C1 | −7.44099238e−009 |
| C2 | −4.60802220e−013 |
| C3 | 5.02597986e−018 |
| C4 | −1.79363655e−021 |
| C5 | 0.00000000e+000 |
| C6 | 0.00000000e+000 |
| C7 | 0.00000000e+000 |
| C8 | 0.00000000e+000 |
| C9 | 0.00000000e+000 |

| SURFACE NO. 28 | |
|---|---|
| K | −1.3933 |
| C1 | 9.49026003e−009 |
| C2 | −3.04824020e−013 |
| C3 | 5.20968102e−017 |
| C4 | −1.43839696e−021 |
| C5 | 0.00000000e+000 |
| C6 | 0.00000000e+000 |
| C7 | 0.00000000e+000 |
| C8 | 0.00000000e+000 |
| C9 | 0.00000000e+000 |

| SURFACE NO. 34 | |
|---|---|
| K | −5.1949 |
| C1 | 3.25802081e−009 |
| C2 | −5.80298629e−014 |
| C3 | 9.16229996e |
| C4 | 2.54735247e−023 |
| C5 | 0.00000000e+000 |
| C6 | 0.00000000e+000 |
| C7 | 0.00000000e+000 |
| C8 | 0.00000000e+000 |
| C9 | 0.00000000e+000 |

| SURFACE NO. 39 | |
|---|---|
| K | −28.1074 |
| C1 | −3.36364630e−010 |
| C2 | 2.19411323e−013 |
| C3 | −7.37665801e−018 |
| C4 | 1.10974039e−022 |
| C5 | 0.00000000e+000 |
| C6 | 0.00000000e+000 |
| C7 | 0.00000000e+000 |
| C8 | 0.00000000e+000 |
| C9 | 0.00000000e+000 |

FIG. 2 shows the paths of imaging light moving towards two field points, namely a central object field point 21 (x=0) and an object field point 22 at the edge of the object field 14. The central object field point 21 is arranged at the penetration point of the optical axis 2 passing through the object plane 6. The optical axis 2 coincides with a principal ray direction which is assigned to the central object field point 21. Along with the optical axis 2, the illumination light path of the central object field point 21 is characterized by two edge rays 23, 24 which simultaneously represent the maximum illumination angles of the central object field point 21 and are also referred to as coma rays. The intensity relationship of these two edge rays 23, 24 is a measure of an energetic telecentricity of the illumination in the object field 14. The illumination light path of the object field point 22 at the edge is characterized by a principal ray 25, which passes through the center of the objective aperture in the pupil planes 9, 19, as well as by two edge rays 26, 27 which represent the maximum illumination angle of the object field point 22 at the edge.

As illustrated schematically in FIG. 2, the lens FLG4 is mechanically connected to a displacement drive 28. The displacement drive 28 enables the lens FLG4 to be displaced along the optical axis (double-headed arrow 29), in other words in the z-direction, and perpendicular to the optical axis 2 (double-headed arrow 30). The lens FLG 4 is however not only displaceable in the x-direction, as it is indicated by the double-headed arrow 30, but also in the y-direction. The displacement drive 28 furthermore enables the lens FLG 4 to be tilted about the center of gravity of the lens, in other words about an axis which is perpendicular to the xz-plane (double-headed arrow 31), and about an axis which passes through the center of gravity of the lens as well and is perpendicular to the yz-plane. By way of the displacement drive 28, the lens FLG4 is displaceable for linear translatory movement and tiltable through two degrees of freedom. In other embodiments of the displacement drive 28, it is conceivable as well to provide a subcombination of these degrees of freedom for displacement of the lens FLG4.

The displacement drive 28 is connected to a central control device 33 of the projection exposure apparatus 1 via a signal which is transmitted via a signal line 32.

The lens FLG 5 is mechanically connected to a displacement drive 34. As already explained above in relation to the displacement drive 28, the displacement drive 34 enables the lens FLG 5 to be displaced through three translatory degrees of freedom and two tilting degrees of freedom as well. Corresponding double-headed arrows have the same reference numerals in FIG. 2. The displacement drive 34 is connected to the control device 33 via a signal which is transmitted via a signal line 35.

The lens FLG 3 may be equipped with a corresponding displacement drive as well. This is not shown in FIG. 2.

The lens REMA1 is mechanically connected to a displacement drive 36. As already explained above in relation to the displacement drive 28, the displacement drive 36 enables the lens REMA1 to be displaced through three translatory degrees of freedom and two tilting degrees of freedom as well. Corresponding double-headed arrows have the same reference numerals in FIG. 2. The displacement drive 36 is connected to the control device 33 via a signal which is transmitted via a signal line 37.

The lens REMA2 is mechanically connected to a displacement drive 38. As already explained above in relation to the displacement drive 28, the displacement drive 38 enables the lens REMA2 to be displaced through three translatory degrees of freedom and two tilting degrees of freedom as well. Corresponding double-headed arrows have the same reference numerals in FIG. 2. The displacement drive 38 is connected to the control device 33 via a signal which is transmitted via a signal line 39.

The displacement drives 28, 34, 36, 38 provide a maximum displacement path in the z-direction which is in the range of 500 µm. A displacement path in the range of 300 µm is often sufficient. The positioning accuracy in the z-direction is 15 µm or better. Such a positioning accuracy of better than 15 µm ensures that a given position can be reached in the z-direction with a maximum deviation of 15 µm.

The displacement drives 28, 34, 36, 38 provide a maximum decentering displacement path in the x- and y-directions which is in the range of 200 µm. A decentering displacement path in the range of 100 µm is often sufficient. The positioning accuracy in the x-direction and in the y-direction is 5 µm or better.

The displacement drives 28, 34, 36, 38 provide a maximum tilting displacement path about the two tilting axes which is in the range of 10 angular minutes. A tilting displacement path in the range of 5 angular minutes is often sufficient. As far as the tilting movement is concerned, the displacement drives 28, 34, 36, 38 have a positioning accuracy of 0.25 angular minutes or better.

The two edge rays 23, 24 define a central radiation sub-bundle 40 which belongs to the central object field point 21. The edge rays 26 and 27 define a radiation sub-bundle 41 at the edge which belongs to the object field point 22 at the edge.

In the lens FLG3, the two radiation sub-bundles 40, 41 overlap by no more than 70% according to the meridional section of FIG. 2.

In the lens FLG4, the two radiation sub-bundles 40, 41 overlap by no more than 50% according to the meridional section of FIG. 2.

In the lens FLG5, the two radiation sub-bundles 40, 41 overlap by no more than 40% according to the meridional section of FIG. 2.

In the lens REMA1, the two radiation sub-bundles 40, 41 do not overlap at all according to the meridional section of FIG. 2; in other words, the two radiation sub-bundles 40, 41 are completely separated from one another in the lens REMA1.

In the lens REMA2, the two radiation sub-bundles 40, 41 overlap by no more than 15% according to the meridional section of FIG. 2.

In the lens REMA3, the two radiation sub-bundles 40, 41 do not overlap by more than 30% according to the meridional section of FIG. 2.

The lens FLG 4 has a focal width or optical power, respectively, of 392 mm. The lens FLG 5 has an optical power of 448 mm. The lens REMA1 has an optical power of −185 mm. The lens REMA 2 has an optical power of 397 mm.

Figure 3:
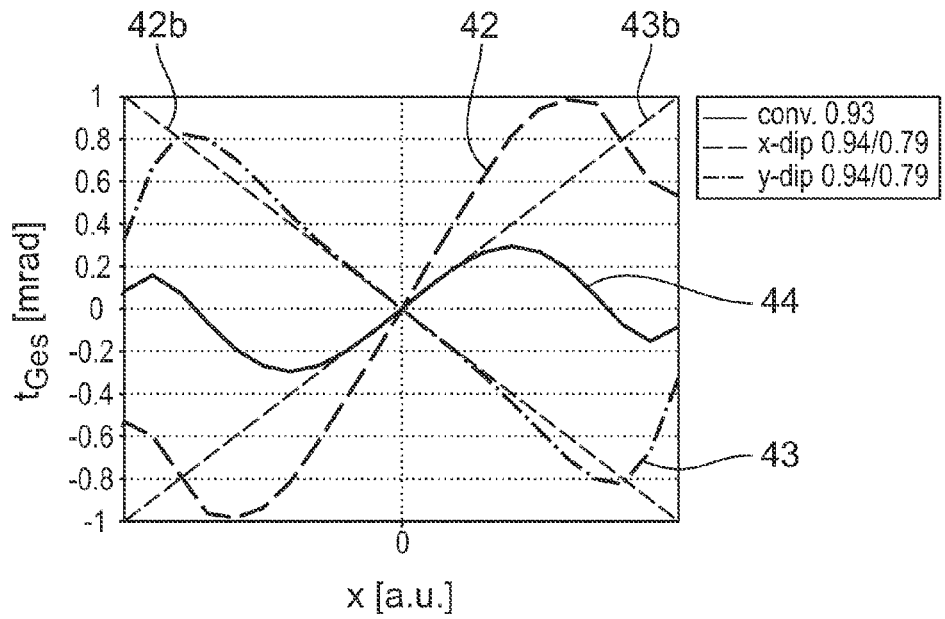
FIG. 3 shows a diagram in which telecentricity values of different illumination settings are represented as a function of an object field height prior to a displacement compensation.
Figure 4:
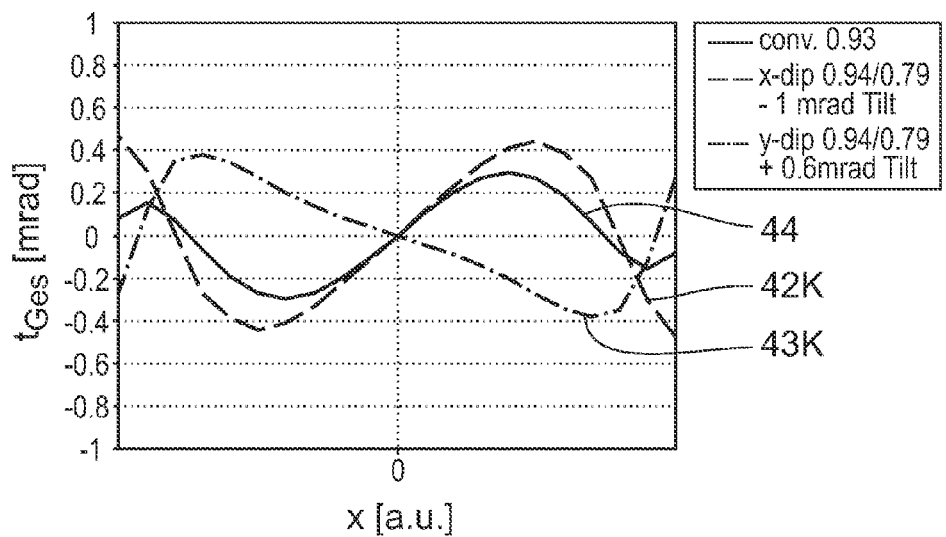
FIG. 4 shows a diagram similar to FIG. 3 representing the telecentricity values of the illumination settings after the displacement compensation.

The following is description, regarding FIGS. 3 and 4, of the effect of a displacement of in each case one lens of the field lens group 15 and one lens of the REMA lens group 18 in the z-direction, in other words along the optical axis 2, on a telecentricity value of the illumination optics 5 relative to the field height, in other words relative to the x-position in the object field 14. The central object field point 21 is arranged at the field height x=0, and the object field point 22 at the edge is arranged at the left-hand edge of the x-values according to FIGS. 3 and 4. The two z-displaceable lenses of the field lens group 15 on the one hand and the REMA lens group 18 on the other may be selected from the following pairs of lenses: FLG4/REMA1, FLG4/REMA 2, FLG5/REMA 1, FLG5/REMA 2, which are displaceable in the z-direction via in each case two of the displacement drives 28, 34, 36, 38. The effect on the telecentricity value explained by FIGS. 3 and 4 is generally also achievable by way of another pair of FLG/REMA lenses which is displaced in the z-direction. FIGS. 3 and 4 show telecentricity values for three different illumination settings.

The following applies: $t_{Ges} = t_x + t_{pb,x}$.

$t_x$ (and correspondingly $t_y$) are defined as follows:

In each field point of the exposed object field is defined a centroid ray of a light bundle assigned to this field point. The centroid ray has the energy-weighted direction of the sub-bundle of light which is emitted by this field point. Under ideal circumstances, the centroid ray of each field point is parallel to a principal ray which is defined by the illumination optics or the projection optics, respectively.

The direction of the principal ray $\vec{s}_0(x,y)$ is known from the design data of the illumination optics or the projection optics, respectively. The principal ray of a field point is defined by the connection line between the field point and the center of the entrance pupil of the projection optics. The direction of the centroid ray at a field point x, y in the object field of the object plane 6 is obtained as follows:

$$\vec{s}(x, y) = \frac{1}{\tilde{E}(x, y)} \int du\, dv \begin{pmatrix} u \\ v \end{pmatrix} E(u, v, x, y)$$

E (u, v, x, y) is the energy distribution at the field point x, y as a function of the pupil coordinates u, v, in other words as a function of the illumination angle which is seen by the respective field point x, y.

$$\begin{pmatrix} u \\ v \end{pmatrix}$$

is the unit vector of the pupil coordinates.

$E(x, y) = \int du\,dv\, E(u, v, x, y)$ is the total energy to which the point x, y is exposed.

For instance, a central object field point $x_0$, $y_0$ sees the radiation of partial radiation bundles from directions u, v which are defined by the penetration point of the respective partial radiation bundle when passing through the pupil planes of the illumination optics 5, for instance through the pupil plane 19. At this illumination setting, the centroid ray s extends along the principal ray only if the different energies or intensities, respectively, of the partial radiation bundle combine to form an integrated centroid ray direction which is parallel to the principal ray direction. This is only the case under ideal circumstances. In practice, there is a deviation between the centroid ray direction $\vec{s}(x, y)$ and the principal ray direction $\vec{s}_0(x,y)$ which is referred to as telecentricity error $\vec{t}(x, y)$:

$$\vec{t}(x,y) = \vec{s}(x,y) - \vec{s}_0(x,y)$$

In the practical use of the projection exposure apparatus 1, it is not the static telecentricity error in a particular object field to be corrected but the scan-integrated telecentricity error at $x = x_0$. This telecentricity error is obtained as follows:

$$\vec{T}(x_0) = \frac{\int dy\, \tilde{E}(x_0, y)\, \vec{t}(x_0, y)}{\int dy\, \tilde{E}(x_0, y)}.$$

Consequently, the telecentricity error is corrected which is integrated by a point (x, e.g. $x_0$) on the reticle moving through the object field in the object plane 5 during the scanning process, wherein a difference is made between an x-telecentricity error (tx) and a y-telecentricity error (ty). The y-telecentricity error is defined as a deviation of the centroid ray from the principal ray perpendicular to the scanning direction. The x-telecentricity error is defined as the deviation of the centroid ray from the principal ray in the scanning direction.

$t_{pb,x}$, which is a pole balance portion of the x-telecentricity, is defined as $$t_{pb,x} = pb_x \cdot NA,$$

with NA being the numerical aperture of the useful light 4.

Figure 27:
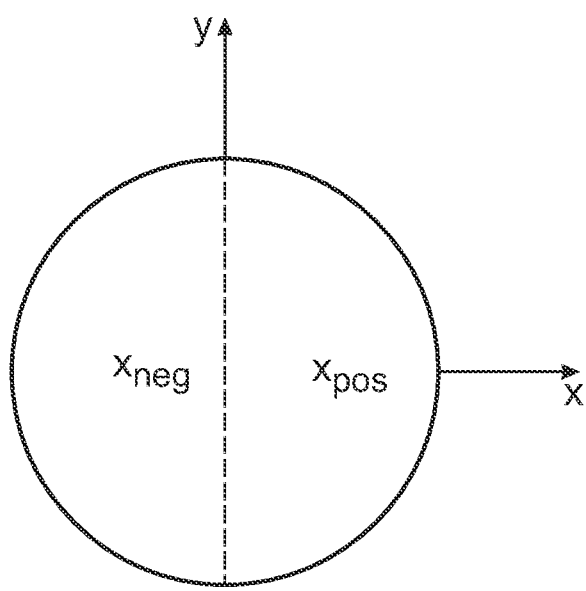
FIG. 27 shows a schematic view of a pupil of the illumination optics of the projection exposure apparatus including a subdivision for defining an x-pole balance.

The definition of $pb_x$, i.e. the x-pole balance, will hereinafter be described by FIG. 27. FIG. 27 shows a schematic view of a free aperture of the illumination optics 5 which is on a level with a pupil plane, for instance with the pupil plane 19, in other words the Figure shows a pupil of the illumination optics 5. The pupil may be subdivided into a pupil half $X_{pos}$ for positive x-values and a pupil half $X_{neg}$ for negative x-values of the pupil. The intensity of the useful light 4 in the two pupil halves $X_{pos}$, $X_{neg}$ is then integrated in such a way that $I(X_{pos})$, $I(X_{neg})$ obtained. $pb_x$ is then obtained as follows:

$$pb_x = \frac{|I(X_{pos}) - I(X_{neg})|}{I(X_{pos}) + I(X_{neg})}$$

FIG. 3 shows telecentricity value curves as a function of the field height before a compensating displacement is carried out.

Figure 23:
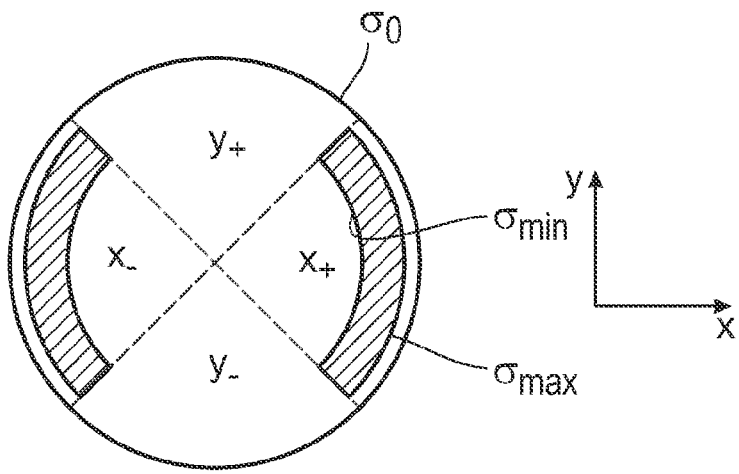
FIGS. 23 to 26 show schematic sections through a light path of the illumination optics which is on a level with a pupil plane having differently adjusted illumination settings.

A telecentricity value curve 42 with a maximum amplitude belongs to an x-dipole setting. FIG. 23 shows a schematic view of an x-dipole setting of this type. The Figure shows a section through the light path of the useful light 4 which is on a level with one of the pupil planes, for instance with the pupil plane 9. This section may be subdivided into four quadrants $X_+$, $Y_+$, $X_-$ and $Y_-$, depending on whether the quadrant opens into the positive x-direction, the positive y-direction, the negative x-direction or the negative y-direction. At the x-dipole setting, an illumination takes place exclusively from the direction of two illumination poles, namely from the direction of the two x-quadrants, instead of between a maximum illumination angle $\sigma_{max}$ and a minimum illumination angle $\sigma_{min}$.

At the x-dipole setting which produces the telecentricity value curve 42, $\sigma_{max}$ amounts to 0.94 times a maximum attainable illumination angle $\sigma_0$ while $\sigma_{min}$ amounts to 0.79 times $\sigma_0$. When the illumination optics 5 is not z-compensated, the telecentricity value curve 42 has a maximum value of +1 mrad at approximately half the field height between the central object field point 21 and an object field point disposed at the edge when seen in the positive x-direction. The telecentricity value curve 42 is point-symmetric with respect to the field height x=0, and therefore has a minimum value of −1 mrad at a field height between the object field points 21 and 22.

Figure 24:
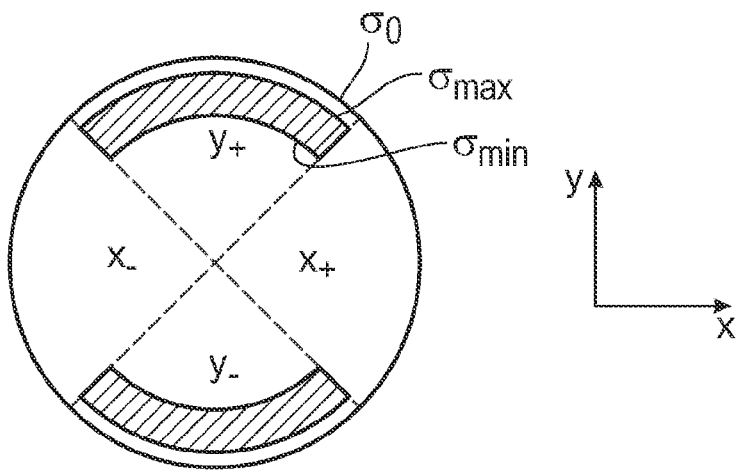

A telecentricity value curve 43 belongs to a y-dipole setting which is illustrated schematically in FIG. 24, which is similar to FIG. 23. At this y-dipole setting, an illumination also takes place exclusively in the y-quadrants between the minimum illumination angle $\sigma_{min}$ (0.79 $\sigma_0$) and the maximum illumination angle $\sigma_{max}$ (0.94 $\sigma_0$). Relative to the field height, the telecentricity value curve 43 is approximately mirror-inverted with respect to the telecentricity value curve 42; if the illumination optics 5 is not z-compensated, the telecentricity value curve 43 has a maximum telecentricity value of 0.8 mrad at a field height which lies between the central object field point 21 and the object field point 22 at the edge and, compared to the telecentricity value curve 42, is closer to the object field point at the edge 22. Likewise, the telecentricity value curve 43 is also point-symmetric with respect to the field height x=0, and therefore has a minimum telecentricity error of approximately −0.8 mrad.

Figure 25:
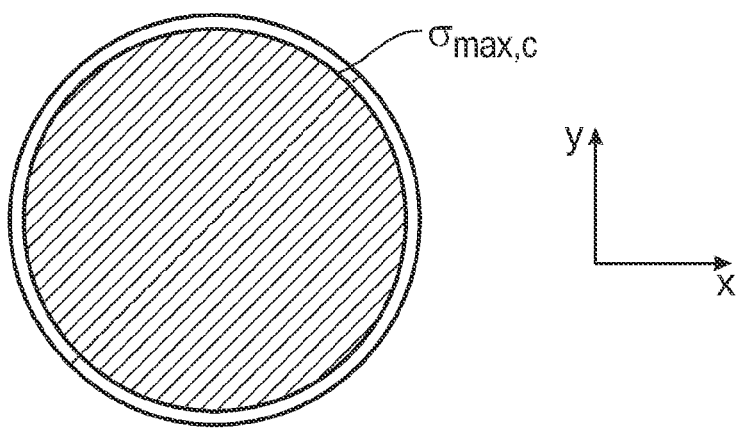

A telecentricity value curve 44 belongs to a conventional illumination setting which is shown by way of example in FIG. 25. At this setting, the illumination optics 5 is filled homogeneously in the pupil plane 9 up to a maximum illumination angle $\sigma_{max}$, c. At the conventional illumination setting which produces the telecentricity value curve 44, $\sigma_{max}$, c is 0.93 times $\sigma_0$. From a qualitative point of view, the approximately sinusoidal shape of the telecentricity value curve 44 resembles the telecentricity value curve 42 of the x-dipole setting. A maximum telecentricity value of approximately 0.3 mrad is achieved in the telecentricity value curve 44 at x-values which are shifted towards smaller x-values as compared to the telecentricity value curve 42. The telecentricity value group 44 is point-symmetric to the field height x=0 as well.

As illustrated by FIG. 4, the combined effect of a z-displacement of a pair of FLG/REMA lenses, such as the pair of FLG4/REMA 1 lenses, enables the telecentricity values to be reduced considerably as far as the absolute maximum values are concerned.

Due to the compensating displacement in the z-direction, the telecentricity value curve 42 has become a telecentricity value curve 42k with a maximum telecentricity value of approximately 0.4 mrad. Compared to the telecentricity value curve 42, the maximum telecentricity value has therefore reduced by almost a factor of 2.5. The telecentricity value curve 42k is point-symmetric with respect to the field height x=0 as well. The telecentricity value curve 42k is obtained from the non-compensated telecentricity value curve 42 by addition of a straight telecentricity value line 42b which is directly proportional to the field height x and is shown by a dashed line in FIG. 3.

At the y-dipole setting, a compensated telecentricity value curve 43k is obtained from the telecentricity value curve 43; after the z-compensation via the pair of FLG/REMA lenses, the curve 43k has a maximum value of slightly less than 0.4 mrad and is still point-symmetric with respect to the field height x=0. Compared to the telecentricity value curve 43, the maximum absolute telecentricity value of the telecentricity value curve 43k has therefore reduced by a factor of more than 2. The telecentricity value curve 43k is obtained from the telecentricity value curve 43 by addition of a straight telecentricity value line 43b which is also shown by a dashed line in FIG. 3 and which is directly proportional to the field height x=0 as well.

The compensating displacement of the pair of FLG/REMA lenses in the z-direction has no impact on the telecentricity value curve 44.

The straight telecentricity value lines 42b, 43b are a measure of the effect on the telecentricity when the pair of FLG/REMA lenses is z-manipulated. One of these lenses is rather sensitive to an in particular linear x-pole balance and is therefore sensitive to an in particular linear telecentricity portion of an x-dipole. This affects the geometric telecentricity. The other one of the z-manipulated lenses of the pair of FLG/REMA lenses is rather sensitive to an in particular linear portion of the geometric telecentricity, in other words it is sensitive to a y-dipole telecentricity. This affects the x-pole balance. Appropriate displacement paths for the z-displacement of in each case one of the FLG and REMA lenses of the pair of FLG/REMA lenses permit correction of either the x-dipole telecentricity or the y-dipole telecentricity. The optimum z-displacement position of the lenses of the pair of FLG/REMA lenses therefore depends on the respective illumination setting.

The following is a greatly simplified description of the setting-dependent behavior of the telecentricity curves according to FIGS. 3 and 4. A contribution of one of the z-manipulated lenses of the pair of FLG/REMA lenses is such that the telecentricity value has a positive slope relative to the field height while a contribution of another one of these lenses is such that the telecentricity value has a negative slope relative to the field height. The relationship between these two contributions can be affected by changing the amount of z-displacement applied to in each case one of the FLG and REMA lenses of the pair of FLG/REMA lenses in such a way that a particular definable z-displacement of the FLG lens on the one hand and of the REMA lens on the other ensures that the absolute telecentricity values are reduced to small maximum values in an optimal manner, as shown by a comparison of FIGS. 3 and 4 in which the maximum value of +/−1 mrad of the telecentricity value curve 42 has been reduced to a maximum value of the telecentricity value curve 42k of slightly greater than +/−0.4.

Figure 5:
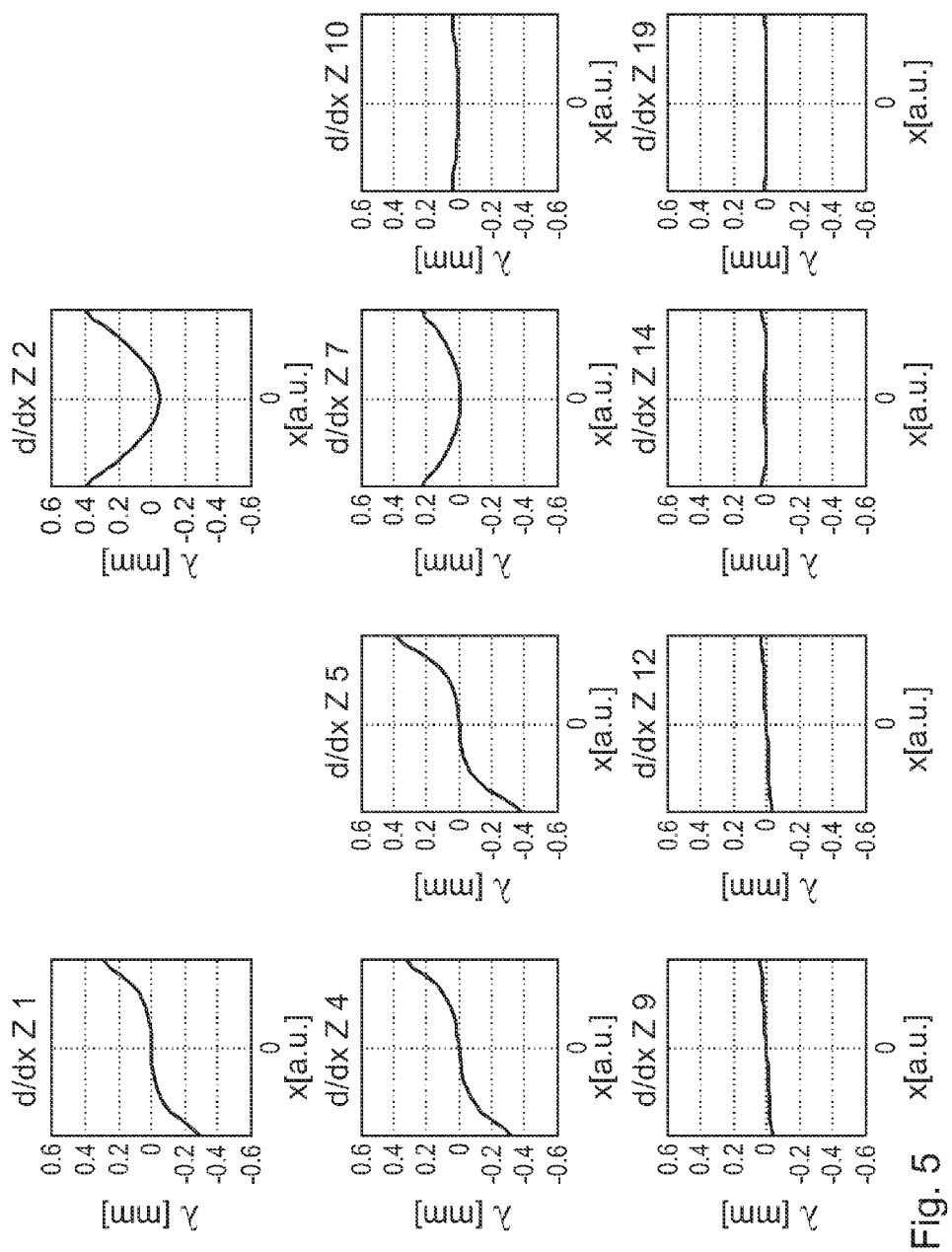
FIG. 5 shows a total of ten diagrams representing field gradients of a wavefront change, caused by a compensating displacement, as an expansion of Zernike polynomials relative to the field height.

FIG. 5 shows how field gradients of Zernike polynomials, which serve to describe the wavefront at a respective field point, are affected if the lens FLG4 is z-displaced by 300 μm. The Zernike polynomials Z1 . . . Z19 are known, for example in the Fringe notation, from mathematical and optical literature.

FIG. 5 shows the field gradients of the Zernike polynomials Z1, Z2, Z4, Z5 Z7, Z9, Z10, Z12, Z14, and Z19. The field gradients of Z1, Z4 and Z5 are influenced by the z-displacement in such a way that a curve is produced which is point-symmetric with respect to the field height x=0, wherein this influence rises for each field gradient towards positive x-values. A comparable point-symmetric behavior with much smaller absolute values, however, can be observed for the field gradients Z9 and Z12. The field gradients Z2 and Z27 produce an approximately parabolic curve which is open upwardly. After the z-displacement of the lens FLG4, the curves of the field gradients Z10, Z14 and Z10 are mirror-symmetric with respect to x=0 as well but have only a small absolute field dependence.

The field gradients Z1, Z4 and Z9 have an impact on a balance between the intensities delivered by the individual illumination poles of an x-dipole or a y-dipole, respectively. At the x-dipole illumination, the intensity relationship from illumination directions $X_+$ and $X_-$ may be influenced by displacing the lens FLG4 in the z-direction. The same applies to the y-dipole illumination setting.

Likewise, the field gradients Z5 and Z12 are also assigned to a balance of the intensity relationship between the poles of a dipole illumination setting, which may therefore be influenced as well by displacing the lens FLG 4 in the z-direction.

The field gradients Z2, Z7 and Z14 are assigned to a uniformity, in other words a homogeneous intensity of the field illumination. A z-displacement of the lens FLG 4 may therefore in particular have an impact on whether the field edge is illuminated with the same intensity as the center of the field.

The field gradients Z10 and Z19 are assigned to the illumination parameter of ellipticity. At an illumination setting in which light is emitted to the object field 14 from all of the four quadrants $X_+$, $Y_+$, $X_-$ and $Y_-$, the z-displacement may for instance have an impact on the relationship between the intensity of the useful light which is emitted to the field points from the two X-quadrants, and the intensity which is emitted to the field points of the object field 14 from the two y-quadrants.

When the lens FLG 4 is displaced in the z-direction by 300 µm, the illumination parameters of particular field points are affected, as will hereinafter be explained by FIGS. 6 to 14.

FIGS. 6 to 8 show the effect of the z-displacement on a wavefront hitting three different field points of the object field 14. FIG. 6 illustrates the effect on the wavefront hitting the central object field point 21; FIG. 8 illustrates the effect on an object field point 45 at the edge seen in the positive x-direction (cf. FIG. 2); and FIG. 7 illustrates the effect on an object field point 46 between the object field points 21 and 45 (cf. FIG. 2). As expected, the z-displacement has a rotationally-symmetric effect on the central object field point. The effect on the object field point 45 (cf. FIG. 8) is slightly asymmetric.

FIGS. 9 to 11 show the effect on a pupil aberration caused by the z-displacement of the lens FLG4. The central object field point (cf. FIG. 9) is affected only to a minimum extent. The object field point 46 is affected in such a way that at the right-hand edge (according to FIG. 10) of the pupil, there is a drift of illumination directions primarily in the radial direction, which is illustrated by arrows in FIG. 10. This effect is even increased by almost one order of magnitude at the object field point 45 near the edge (cf. FIG. 11).

FIGS. 12 to 14 show the effect on a pupil intensity variation of the three field points 21, 46 and 45 caused by the z-displacement of the lens FLG4. The central object field point (cf. FIG. 9) is virtually not affected at all. The object field point 46 (cf. FIG. 13) is affected in such a way that there is an intensity increase across the pupil in a sickle-shaped region on the right-hand side of the pupil. This effect can be observed at the object field point 45 near the edge as well; compared to the object field point 46, it is increased, however, by almost one order of magnitude.

Figure 15:
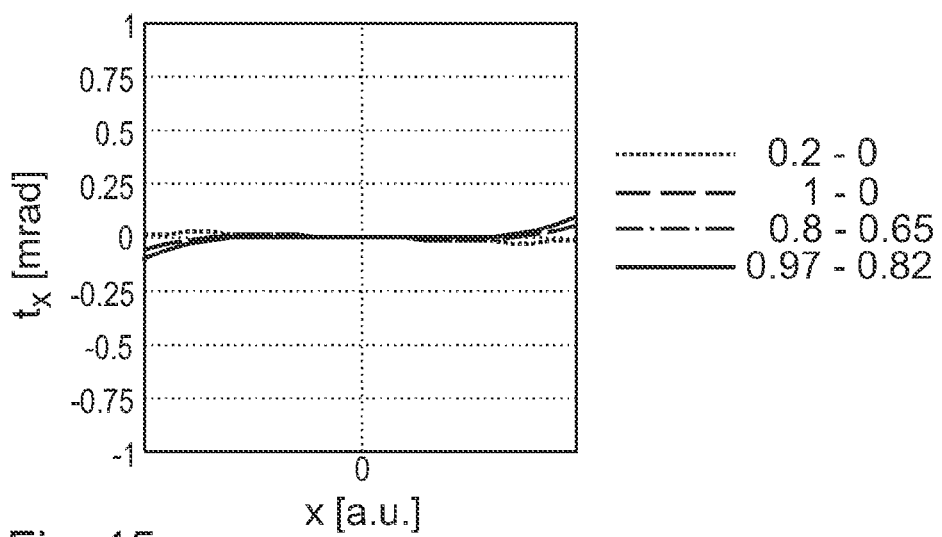
FIG. 15 shows a diagram for various annular illumination settings, the diagram representing the dependence of a geometric x-telecentricity on the field height due to the compensating displacement.
Figure 26:
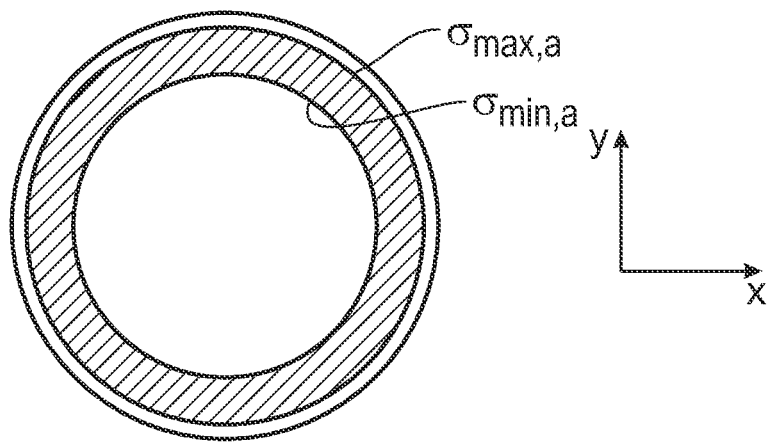

FIG. 15 shows, for various conventional settings according to FIG. 25 as well as for annular settings, how the geometric x-telecentricity across the field height is affected when the lens FLG 4 is z-displaced by 300 µm. An example of an annular setting is shown in FIG. 26 which is similar to FIGS. 23 to 25. An object field point is illuminated annularly by the pupil plane 9 with a minimum illumination angle $\sigma_{min}$, a and a maximum illumination angle $\sigma_{max}$, a.

FIG. 15 shows the geometric x-telecentricity ($t_x$) for a total of four illumination settings, namely for a conventional illumination setting with a very small maximum illumination setting of $\sigma_{max}$, c of 0.2 $\sigma_0$, for a conventional setting which fills out the entire pupil of the illumination optics 5 ($\sigma_{ma}$, c=1 $\sigma_0$), for an annular setting with $\sigma_{min}$, a=0.65 and $\sigma_{max}$, a=0.8 and for an annular illumination setting with $\sigma_{min}$, a=0.82 and $\sigma_{max}$, a=0.97. The geometric x-telecentricity is affected the most by the z-displacement of the lens FLG4 at the last mentioned annular setting with the largest illumination angles. This is evidently obvious because the edge effects described above by FIGS. 6 to 14 are most apparent at this illumination setting.

Figure 16:
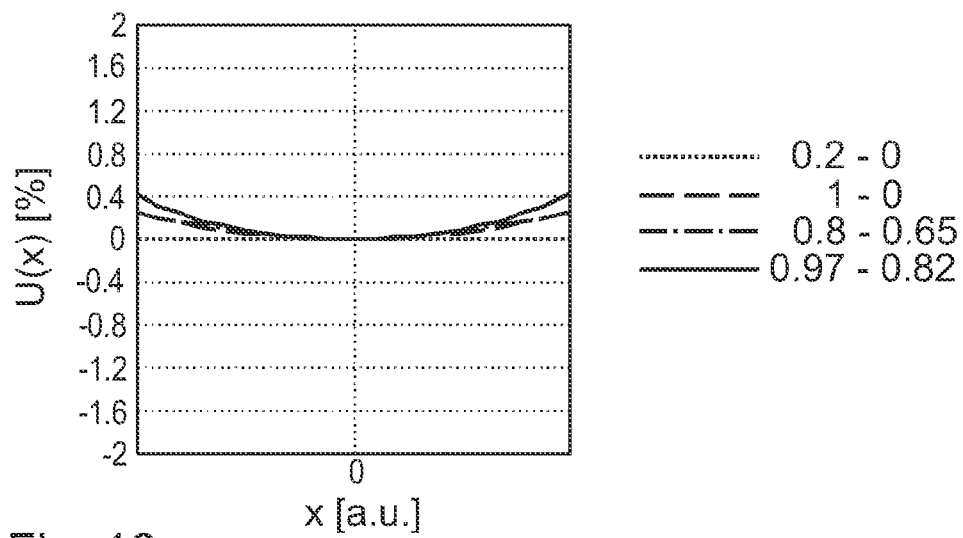
FIG. 16 shows a diagram, similar to FIG. 15, for the various annular illumination settings, the diagram representing the dependence of a uniformity on the field height due to the compensating displacement.

FIG. 16 shows the dependence of a uniformity U on the field height for the same four illumination settings as shown in FIG. 15.

The uniformity U is defined as follows:

$$U(x) = 100\% \frac{I(x) - I(x=0)}{I(x=0)}$$

In this example, the annular illumination setting with the large illumination angles is again affected the most.

Figure 17:
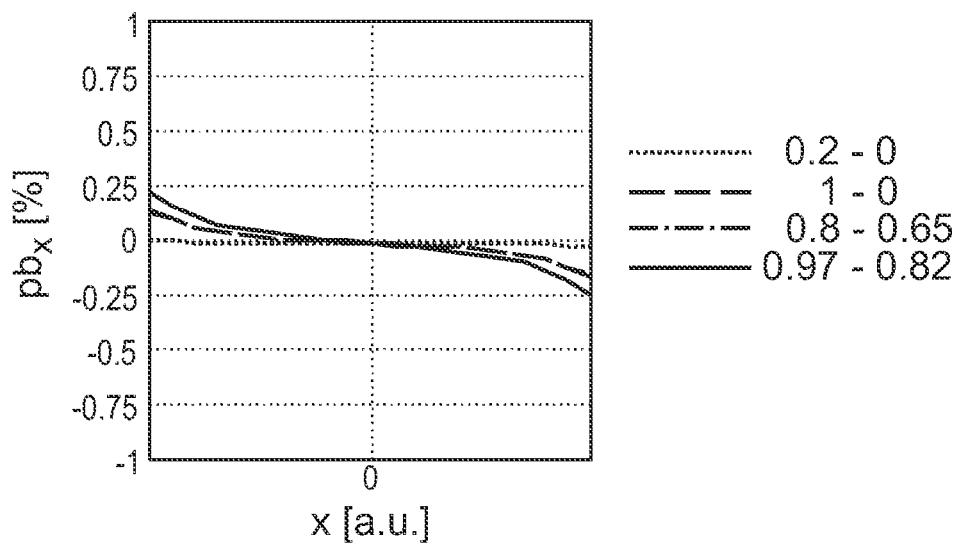
FIG. 17 shows a diagram, similar to FIG. 15, for the various annular illumination settings, the diagram representing the dependence of an x-pole balance on the field height due to the compensating displacement.

FIG. 17 illustrates, for the same four illumination settings as shown in FIG. 15, the dependence of a balance of intensities emitted by the quadrants $X_{pos}/X_{neg}$ on the field height, in other words the x-pole balance $pb_x$. This results in a curve which is mirror-inverted with respect to the geometric x-telecentricity according to FIG. 15.

The ellipticity is another parameter for determining the quality of illumination of the object field in the object plane 6. The determination of the ellipticity helps to obtain more precise information with regard to the distribution of energy or intensity, respectively, across the entrance pupil of the projection optics 11. To this end, the entrance pupil is divided into eight octants which are numbered in an anticlockwise direction from $O_1$ to $O_8$, as it is common practice in mathematics, so that the octants $O_1$, $O_2$ are disposed in the first quadrant. The contribution of energy or intensity, respectively, delivered by the octants $O_1$ to $O_8$ of the entrance pupil for illuminating a field point is hereinafter referred to as energy or intensity contribution, respectively, $I_1$ to $I_8$.

The following quantity is referred to as HV (horizontal/vertical)-ellipticity:

$$E_{HV} = \left(\frac{I2 + I3 + I6 + I7}{I1 + I8 + I4 + I5} - 1\right) \cdot 100\%.$$

The following quantity is referred to as ST-ellipticity:

$$E_{ST} = \left(\frac{I3 + I4 + I7 + I8}{I1 + I2 + I5 + I6} - 1\right) \cdot 100\%$$

According to the above description with respect to the telecentricity error, the ellipticity may also determined for a particular object field point $x_0$, $y_0$ or for a scan-integrated illumination ($x=x_0$, y-integrated).

Figure 18:
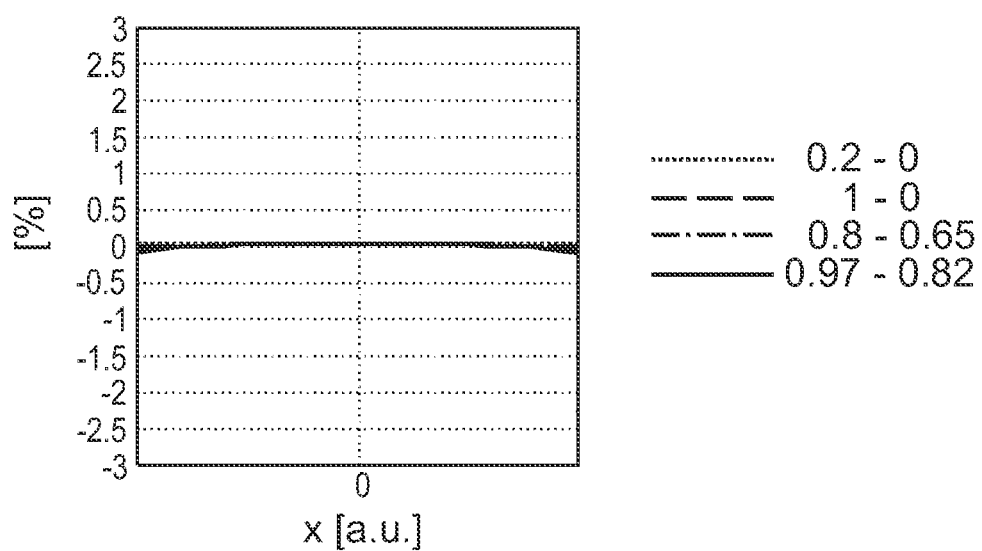
FIG. 18 shows a diagram, similar to FIG. 15, for the various annular illumination settings, the diagram representing the dependence of an ellipticity on the field height due to the compensating displacement.
Figure 19:
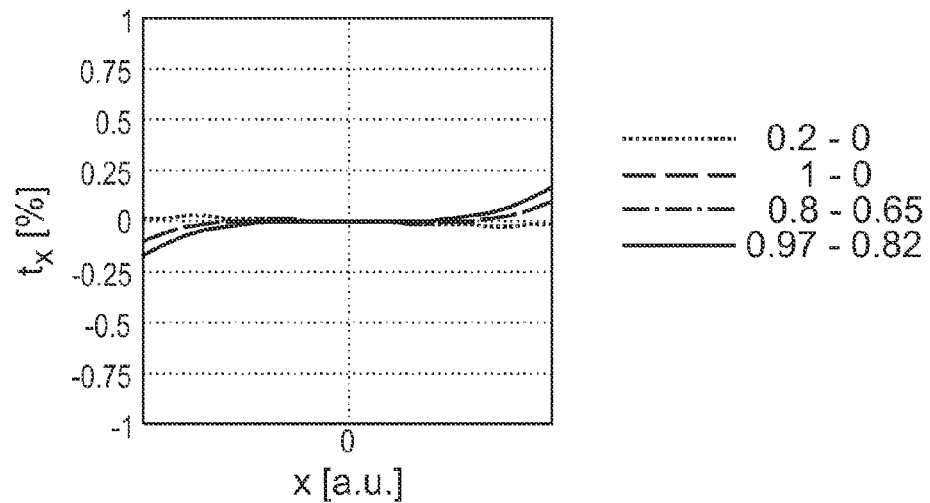
FIG. 19 shows a diagram for various x-dipole illumination settings, the diagram representing the dependence of a geometric x-telecentricity on the field height due to the compensating displacement.
Figure 20:
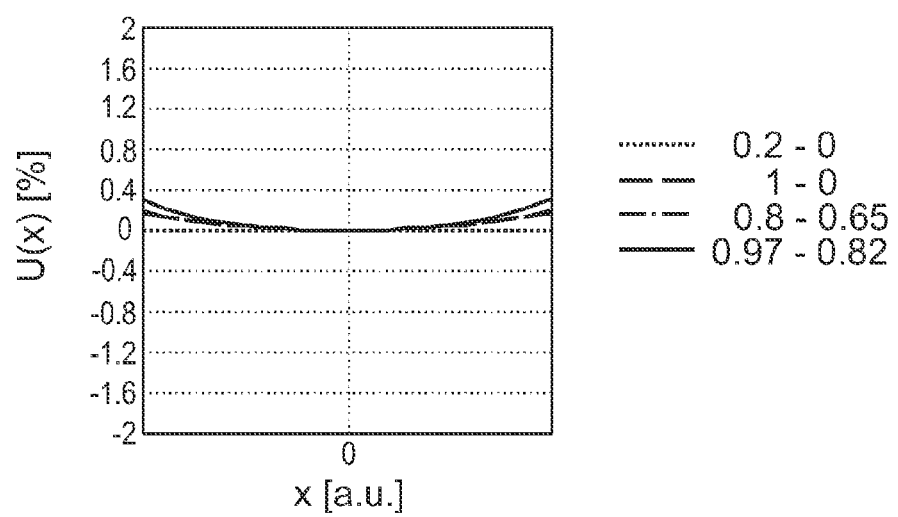
FIG. 20 shows a diagram, similar to FIG. 15, for the various x-dipole illumination settings, the diagram representing the dependence of a uniformity on the field height due to the compensating displacement.
Figure 21:
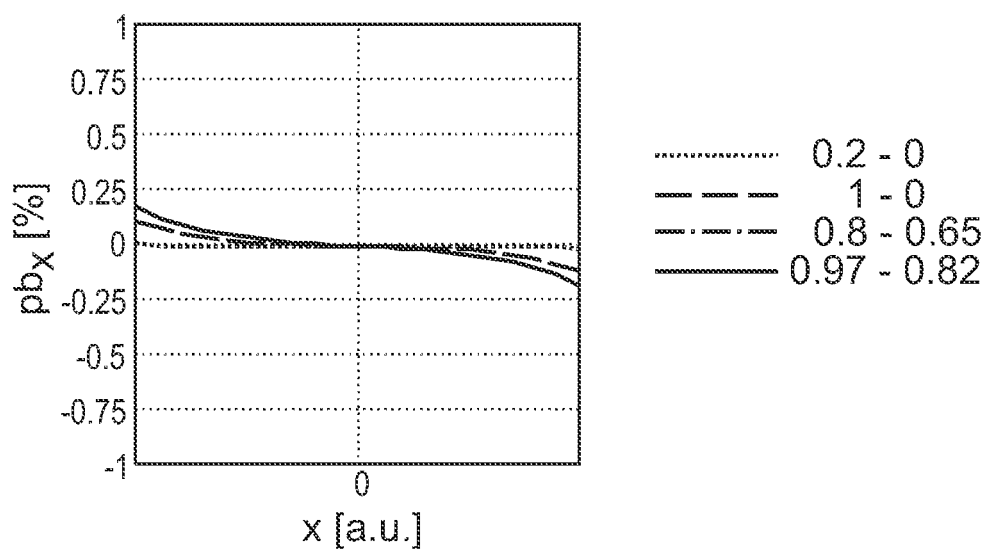
FIG. 21 shows a diagram, similar to FIG. 15, for the various x-dipole illumination settings, the diagram representing the dependence of an x-pole balance on the field height due to the compensating displacement.
Figure 22:
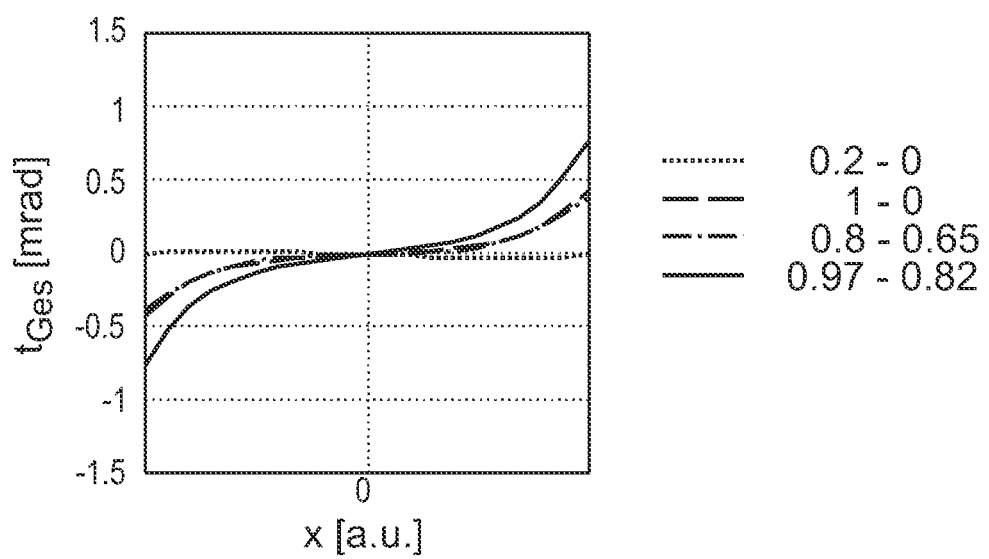
FIG. 22 shows a diagram, similar to FIG. 15, for the various x-dipole illumination settings, the diagram representing the dependence of a total telecentricity on the field height due to the compensating displacement.

FIG. 18 illustrates, again with respect to the four illumination settings according to FIG. 15, the dependence of the ellipticity $E_{HV}$ on the field height. This dependence is very small and mirror-inverted with respect to the uniformity dependence according to FIG. 16.

FIGS. 19 to 22, which are similar to FIGS. 15 to 18, illustrate the effects on the illumination parameters of geometric x-telecentricity $t_x$ (FIG. 19), uniformity $U_{(x)}$ (FIG. 20), x-pole balance $pb_x$ (FIG. 21) as well as a static total telecentricity $t_{Ges}$ (FIG. 22) when the lens FLG 4 is displaced by 300 μm; this time, however, four different x-dipole settings are observed. At a first one of these four x-dipole settings, an illumination takes place between $\sigma_{min}=0$ and $\sigma_{max}=0.2\,\sigma_0$; in other words, light is emitted by two sectors on the tips of the quadrants $X_+$, $X_-$. The second one of these four illumination settings is such that the quadrants $X_+$, $X_-$ are completely illuminated. The third one of these illumination settings is an x-dipole illumination with $\sigma_{min}=0.65\,\sigma_0$ and $\sigma_{max}=0.8\,\sigma_0$. The fourth one of these x-dipole illumination settings shows an illumination with $\sigma_{min}=0.82\,\sigma_0$ and $\sigma_{max}=0.97\,\sigma_0$. When the lens FLG4 is displaced in the z-direction, the last-mentioned illumination setting, in which primarily large illumination angles are used, has again the greatest impact on the illumination parameters shown in FIGS. 19 to 22.

The displacement compensation via a pair of FLG/REMA lenses starts off by determining an actual illumination state of the illumination optics 5 via a measuring instrument. This actual illumination state is then compared to a desired illumination state. If this difference exceeds a given tolerance value, the lenses of the pair of FLG/REMA lenses are displaced in order to compensate for differences between the actual illumination state and the desired illumination state.

The effect of the z-displacement carried out during the displacement compensation has been explained above.

Decentering a pair of FLG/REMA lenses may in particular have an impact on the telecentricity and the balance of the poles. In particular an illumination distribution across the pupil plane or across the field plane may be displaced in the x-direction and/or in the y-direction, which affects these illumination parameters to a corresponding degree.

A tilting displacement of one of the FLG/REMA lenses through five angular minutes has approximately the same effect on the illumination parameters as a decentering displacement in the x-direction and/or the y-direction by 100 μm.

The following pairs of FLG/REMA lenses have turned out to be particularly suitable for the compensating displacement: FLG4/REMA1 and FLG5/REMA2.

Via the projection exposure apparatus 1, at least a part of the reticle 7 is imaged onto a region of a light-sensitive layer on the wafer 13 for lithographic production of a microstructured or nanostructured component. Depending on whether the projection exposure apparatus 1 is a scanner or a stepper, the reticle 7 and the wafer 13 are either displaced continuously in the y-direction in a temporally synchronized manner (scanner) or they are displaced gradually (stepper).

Other embodiments (not shown) of the illumination optics may include other numbers of FLG lenses or REMA lenses, in particular even higher numbers of lenses. The condenser group 15 may for instance include up to eleven components or even more components. Likewise, the objective group 18 may include up to seventeen components or even more components.

What is claimed is:

1. An illumination optics configured to illuminate an object field, the illumination optics comprising:
a condenser group comprising optical components configured to guide a bundle of useful light along a path, the optical components comprising a first optical component having positive refractive power or negative refractive power;
an objective group comprising bundle-guiding components arranged downstream of the condenser group in the path of useful light, the bundle-guiding components comprising a first bundle-guiding component;
first and second displacement drives; and
a control device,
wherein:
the first displacement drive is configured to displace the first optical component;
the second displacement drive is configured to displace the first bundle-guiding component;
the control device is configured so that, during use of the illumination optics: a) the control device sends a first signal to the first displacement drive so that the first displacement drive displaces the first optical component; and b) the control drive sends a second signal to the second displacement drive so that the second displacement drive displaces the first bundle-guiding component, thereby reducing an absolute value of a uniformity of an illumination state of the illumination optics; and
the illumination optics is configured to be used in a projection exposure apparatus for microlithography.

2. The illumination optics according to claim 1, wherein at least one component is displaceable along a principal ray direction of a central object field point, the at least one component being selected from the group consisting of the first optical component and the first bundle-guiding component.

3. The illumination optics according to claim 2, wherein the first displacement drive and/or the second displacement drive is configured to allow a displacement path in the range of 1 mm along the principal ray direction of the central object field point.

4. The illumination optics according to claim 3, wherein the first displacement drive and/or the second displacement drive has a positioning accuracy of better than 50 μm.

5. The illumination optics according to claim 1, wherein at least one component is displaceable along at least one axis which is perpendicular to a principal ray direction of a central object field point, and the at least one component is selected from the group consisting of the first optical component and the first bundle-guiding component.

6. The illumination optics according to claim 5, wherein the first displacement drive and/or the second displacement drive is configured to provide a decentering displacement path in the range of 400 μm.

7. The illumination optics according to claim 6, wherein the first displacement drive and/or the second displacement drive has a positioning accuracy of at least 20 μm.

8. The illumination optics according to claim 1, wherein at least one component is tiltable about at least one tilting axis which is perpendicular to a principal ray direction of a central object field point, and the at least one component is selected from the group consisting of the first optical component and the first bundle-guiding component.

9. The illumination optics according to claim 8, wherein the first displacement drive and/or the second displacement drive has a tilting displacement path in the range of 10 angular minutes.

10. The illumination optics according to claim 9, wherein the first displacement drive and/or the second displacement drive has a positioning accuracy of better than 0.5 angular minutes.

11. The illumination optics according to claim 1, wherein, during use of the illumination optics, the first optical component is a component in which two radiation sub-bundles overlap by a maximum of 70% in a meridional section which includes the two object field points, one of the radiation sub-bundles belonging to a central object field point and another of the radiation sub-bundles belonging to an object field point at the edge.

12. The illumination optics according to claim 1, wherein, during use of the illumination optics, the first bundle-guiding component is a component in which two radiation sub-bundles overlap by a maximum of 30% in the meridional section which includes the two object field points, one of the radiation sub-bundles belonging to a central field point, and another of the radiation sub-bundles belonging to an object field point at the edge.

13. The illumination optics according to claim 1, wherein the first optical component has an absolute value of its focal length which is smaller than 450 mm.

14. The illumination optics according to claim 1, wherein the first bundle-guiding component has an absolute value of its focal length which is smaller than 450 mm.

15. The illumination optics according to claim 1, wherein the condenser group comprises at most eleven optical components configured to guide the bundle of useful light, and at most two of the optical components of the condenser group are displaceable.

16. The illumination optics according to claim 1, wherein the objective group comprises at most seventeen bundle-guiding components configured to guide the bundle of useful light, and at most two of the bundle-guiding components of the objective group are displaceable.

17. A system, comprising:
a light source; and
an illumination optics according to claim 1.

18. An illumination system according to claim 17, further comprising an adjustment device configured to define an illumination setting.

19. An apparatus, comprising:
an illumination optics according to claim 1; and
a projection objective configured to image the object field into an image field,
wherein the apparatus is a projection exposure apparatus.

20. A method, comprising:
using a projection exposure apparatus to produce structured components, the projection exposure apparatus comprising:
an illumination optics according to claim 1; and
a projection objective configured to image the object field into an image field.

21. The method of claim 20, comprising:
determining an actual illumination state of the illumination optics;
determining a deviation of the actual illumination state of the illumination optics from a desired illumination state of the illumination optics; and
displacing the first optical component and the first bundle-guiding component to reduce the difference between a uniformity of the actual illumination state of the illumination optics and a uniformity of the desired illumination state of the illumination optics.

22. The method of claim 21, wherein displacing the first optical element and the first bundle-guiding element also reduces the difference between a telecentricity of the actual illumination state of the illumination optics and a telecentricity of the desired illumination state of the illumination optics.

23. The illumination optics of claim 1, wherein the first optical component has positive refractive power.

24. The illumination optics of claim 1, wherein the first optical component has negative refractive power.

25. The illumination optics of claim 1, wherein the first optical component is a lens.

26. The illumination optics according to claim 1, wherein the displacement of the first optical element and the first bundle-guiding element also reduces an absolute value of a telecentricity of the illumination state of the illumination optics.

27. An illumination optics configured to illuminate an object field, the illumination optics comprising:
a condenser group comprising optical components configured to guide a bundle of useful light along a path, the optical components comprising a first optical component; and
an objective group comprising bundle-guiding components arranged downstream of the condenser group in the path of useful light, the bundle-guiding components comprising a first bundle-guiding component,
wherein:
the first optical component and the first bundle-guiding component are displaceable to compensate deviations of an actual illumination state of the object field from a desired illumination state of the object field;
during use of the illumination optics, the first optical component is a component in which two radiation sub-bundles overlap by a maximum of 70% in a meridional section which includes the two object field points, one of the radiation sub-bundles belonging to a central object field point and another of the radiation sub-bundles belonging to an object field point at the edge; and
the illumination optics is configured to be used in a projection exposure apparatus for microlithography.

28. An illumination optics configured to illuminate an object field, the illumination optics comprising:
a condenser group comprising optical components configured to guide a bundle of useful light along a path, the optical components comprising a first optical component; and
an objective group comprising bundle-guiding components arranged downstream of the condenser group in the path of useful light, the bundle-guiding components comprising a first bundle-guiding component,
wherein:
the first optical component and the first bundle-guiding component are displaceable to compensate deviations of an actual illumination state of the object field from a desired illumination state of the object field;
during use of the illumination optics, the first bundle-guiding component is a component in which two radiation sub-bundles overlap by a maximum of 30% in the meridional section which includes the two object field points, one of the radiation sub-bundles belonging to a central field point, and another of the radiation sub-bundles belonging to an object field point at the edge; and
the illumination optics is configured to be used in a projection exposure apparatus for microlithography.

* * * * *

UNITED STATES PATENT AND TRADEMARK OFFICE
CERTIFICATE OF CORRECTION

PATENT NO. : 8,705,000 B2
APPLICATION NO. : 12/846470
DATED : April 22, 2014
INVENTOR(S) : Artur Hoegele and Markus Deguenther It is certified that error appears in the above-identified patent and that said Letters Patent is hereby corrected as shown below:

In the Specification

In Col. 11, line 64, delete "$E(x, y)$" and insert -- $\tilde{E}(x, y)$ --.

Signed and Sealed this
Fifth Day of August, 2014

Michelle K. Lee
*Deputy Director of the United States Patent and Trademark Office*